(12) United States Patent
Ahn et al.

(10) Patent No.: US 8,836,943 B2
(45) Date of Patent: Sep. 16, 2014

(54) WORKPIECE ALIGNMENT DEVICE

(75) Inventors: Sung Min Ahn, Suwon-si (KR); Sang Don Jang, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 155 days.

(21) Appl. No.: 13/273,549

(22) Filed: Oct. 14, 2011

(65) Prior Publication Data

US 2012/0099107 A1    Apr. 26, 2012

(30) Foreign Application Priority Data

Oct. 25, 2010   (KR) ........................ 10-2010-0103789

(51) Int. Cl.
*G01B 11/00* (2006.01)
*G01B 11/14* (2006.01)
*G03F 7/20* (2006.01)
*G03F 9/00* (2006.01)
*G01B 11/02* (2006.01)

(52) U.S. Cl.
CPC .............. *G01B 11/02* (2013.01); *G01B 11/002* (2013.01); *G03F 7/70275* (2013.01); *G03F 9/7088* (2013.01)
USPC ............................ 356/400; 356/401; 356/614

(58) Field of Classification Search
None
See application file for complete search history.

(56) References Cited

U.S. PATENT DOCUMENTS

| | | | |
|---|---|---|---|
| 5,137,363 A * | 8/1992 | Kosugi et al. ................. | 356/401 |
| 5,481,362 A * | 1/1996 | Van Den Brink et al. .... | 356/401 |
| 2003/0231290 A1 | 12/2003 | Tsujikawa et al. | |
| 2007/0216884 A1 | 9/2007 | Nagasaka | |
| 2009/0219498 A1 | 9/2009 | Kono | |
| 2011/0115057 A1* | 5/2011 | Harn et al. .................... | 257/620 |
| 2012/0225152 A1* | 9/2012 | Wuister et al. ................ | 425/150 |

FOREIGN PATENT DOCUMENTS

| | | | |
|---|---|---|---|
| JP | 07230948 A | * | 8/1995 |
| JP | 9 186079 | | 7/1997 |
| JP | 2001-514804 | | 9/2001 |
| KR | 20090004905 A | | 1/2009 |
| KR | 20090093837 A | | 9/2009 |
| WO | WO 2011064020 A1 | * | 6/2011 |

OTHER PUBLICATIONS

Office Action from a counterpart Korean application dated Apr. 3, 2012 (without translation).

* cited by examiner

*Primary Examiner* — Gordon J Stock, Jr.
(74) *Attorney, Agent, or Firm* — Harness, Dickey & Pierce, P.L.C.

(57) ABSTRACT

An example embodiment relates to an alignment device including an optical aligner system including a plurality of aligners configured to measure a position of a workpiece having a plurality of alignment marks, and an optical member. The optical member is configured to diverge alignment beams reflected from neighboring alignment marks of the plurality of alignment marks and transmit the beams to neighboring aligners of the plurality of aligners respectively if a distance between the neighboring aligners is greater than a distance between the neighboring alignment marks.

18 Claims, 7 Drawing Sheets

WORKPIECE ALIGNMENT DEVICE

CROSS-REFERENCE TO RELATED APPLICATION

This application claims priority under 35 U.S.C. §119 to Korean Patent Application No. 2010-0103789, filed on Oct. 25, 2010 in the Korean Intellectual Property Office, the contents of which is incorporated herein in its entirety by reference.

BACKGROUND

1. Field

Example embodiments relate to a substrate alignment device to perform alignment for overlay in an exposure apparatus.

2. Description of the Related Art

A variety of exposure apparatuses may be used to manufacture semiconductor devices and/or liquid crystal display devices. These exposure apparatuses may employ a reticle or a mask provided with a circuit pattern thereon. An image of the circuit pattern may be projected onto a photoresist-coated workpiece (e.g., substrate or wafer) through a projection lens system.

Manufacturing semiconductor devices may require accurate alignment of circuit patterns because it may be necessary to inscribe circuit patterns over circuit pattern(s) that have been formed on a wafer. Therefore, some exposure apparatuses include an aligner to optically detect an alignment mark formed on a wafer. The aligner detects a position of an alignment mark in a fixed coordinate system (e.g., an XY-coordinate system). The coordinate system may designate a position to which the wafer will be moved for alignment.

One method for detecting the alignment mark is a light beam scanning method. The light beam scanning method is a method including focusing a light beam (e.g., a laser beam) on a spot of a wafer, performing relative movement between an alignment mark and the spot to scan the alignment mark on the basis of the spot, and photoelectrically detecting scattered or diffracted light directed from the alignment mark using photo-multipliers and/or photodiodes. A second method is an image forming method including illuminating a region of an alignment mark on a wafer, picking up an image of the alignment mark using a television camera (for example, a Charge Coupled Device (CCD)) to generate a video signal, and processing the video signal to detect a position of the alignment mark.

SUMMARY

Some example embodiments relate to an alignment device which may perform alignment using multiple aligners even if the separation distance between some aligners is greater than the separation distance between alignment marks on the workpiece being aligned. Other example embodiments relate an alignment device which may perform alignment in correspondence to displacement of a workpiece by moving measuring locations of multiple aligners respectively.

In accordance with one example embodiment, an alignment device includes an optical aligner system including a plurality of aligners configured to measure a position of a workpiece having a plurality of alignment marks. The alignment device includes an optical member to diverge alignment beams reflected from neighboring alignment marks of the plurality of alignment marks and to transmit the beams to neighboring aligners of the plurality of aligners respectively if a distance between the neighboring aligners is greater than a distance between the neighboring alignment marks.

The optical member may include a first optical element having a first reflective face and a second reflective face perpendicular to each other, a second optical element having a third reflective face facing the first reflective face of the first optical element, and a third optical element having a fourth reflective face facing the second reflective face of the first optical element.

A fourth optical element having a fifth reflective face may be provided between any one of the neighboring aligners and the second optical element, and a fifth optical element having a sixth reflective face may be provided between the other one of the neighboring aligners and the third optical element.

The first reflective face and the second reflective face of the first optical element may be arranged such that a normal of each reflective face and the alignment beam reflected from a corresponding one of the neighboring alignment marks form an acute angle with at least one of the first reflective face and the second reflective face.

The first optical element may include a prism.

The first optical element may include symmetrically arranged two mirrors.

The second optical element may include a mirror.

The third optical element may include a mirror.

The first optical element may be configured to move in an axial direction to enable measurement even if a distance between the plurality of alignment marks is changed.

The second optical element and the third optical element may be configured to move in an axial direction to enable measurement even if a distance between the plurality of alignment marks is changed.

The alignment device may further include a transfer device configured to move the first optical element, the second optical element and the third optical element, and the transfer device may be configured to operate manually or automatically.

Each of the plurality of aligners may have a relatively long working distance (WD) from an aligner lens tip to the workpiece owing to a combination of high and low magnifications.

The alignment device may further include a stage configured to support the workpiece and a drive unit configured to move the stage.

In accordance with another example embodiment, an alignment device includes a first optical aligner system configured to measure a position of a first workpiece having at least one alignment mark, and a second optical aligner system configured to measure a position of a second workpiece having at least one alignment mark. The alignment device includes an optical member configured to diverge alignment beams reflected from the alignment marks of the first workpiece the second workpiece, and to transmit the beams to the first optical aligner system and the second optical aligner system respectively if a distance between the first optical aligner system and the second optical aligner system is greater than a distance between the alignment marks of the first workpiece and the second workpiece.

The optical member may include a first optical element having a first reflective face and a second reflective face perpendicular to each other, a second optical element having a third reflective face facing the first reflective face of the first optical element, and a third optical element having a fourth reflective face facing the second reflective face of the first optical element.

The first optical element may have an inverted-pyramidal shape to diverge the reflected alignment beams via the first reflective face and the second reflective face, or may have a pyramidal shape to diverge the alignment beams, having passed through the bottom thereof, via the first and second reflective faces.

The first optical element may be configured to move in an axial direction to enable measurement even if a distance between the first workpiece and the second workpiece is changed.

The second optical element and the third optical element may be configured to move in an axial direction to enable measurement even if a distance between the first workpiece and the second workpiece is changed.

Each of the plurality of aligners may have a relatively long working distance (WD) from an aligner lens tip to the workpiece owing to a combination of high and low magnifications.

BRIEF DESCRIPTION OF THE DRAWINGS

The foregoing and other features and advantages of the example embodiments will be apparent from the more particular description of non-limiting example embodiments, as illustrated in the accompanying drawings in which like reference characters refer to the same parts throughout the different views. The drawings are not necessarily to scale, emphasis instead being placed upon illustrating the principles of the example embodiments. In the drawings.

DETAILED DESCRIPTION

Figure 1:
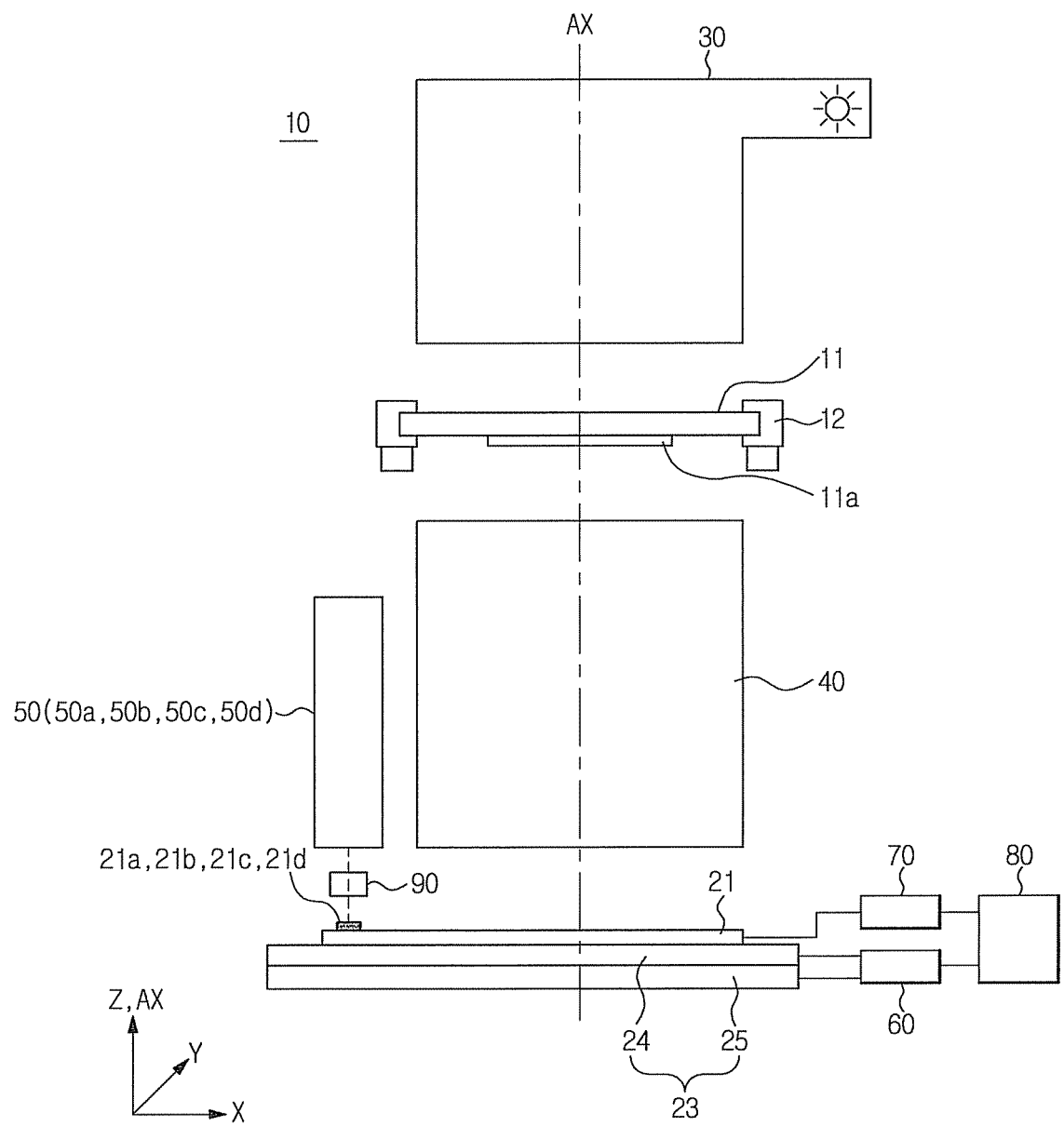
FIG. 1 is a view schematically illustrating a configuration of an exposure apparatus according to an example embodiment.

Example embodiments will now be described more fully with reference to the accompanying drawings, in which some example embodiments are shown. Example embodiments, may, however, be embodied in many different forms and should not be construed as being limited to the example embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a substrate alignment device according to an example embodiment will be described in detail with reference to the accompanying drawings.

FIG. 1 is a view schematically illustrating a configuration of an exposure apparatus according to an example embodiment.

As illustrated in FIG. 1, the exposure apparatus 10 may include a reticle 11, an optical illuminator system 30, an optical projector 40, an optical aligner system 50 including a plurality of optical aligners (50a, 50b, 50c, and 50d), an optical member 90, and a stage 23.

The reticle 11 (or mask) is placed on a reticle stage 12. The reticle 11 has a circuit pattern on a patterned region 11a thereof. The patterned region 11a is uniformly illuminated by the optical illuminator 30. A scaled image of the circuit pattern on the patterned region 11a may be projected onto a workpiece 21 (e.g., wafer or substrate) via the optical projector 40. Here, the direction of an optical axis AX of the optical projector 40 is referred to a Z-axis and a plane perpendicular to the optical axis AX is referred to an XY-plane. The X- and Y-axes are perpendicular to each other.

A workpiece 21 (e.g., wafer or substrate) may be placed on the stage 23. The stage 23 is movable along X-, Y- and Z-axes by a drive unit 60. The stage 23 includes an XY-axes stage member 24 which is movable along X- and Y-axes and a Z-axis stage member 25 which is movable along a Z-axis. A position of the stage 23 in XY coordinate system is detected by a stage position detector 70 and the detected coordinate position is output to a main controller 80. The stage position detector 70 may be an interferometer, for example a laser interferometer, but example embodiments are not limited thereto.

The optical aligners 50a, 50b, 50c, and 50d, in the exposure apparatus 10 serve to detect coordinate positions of alignment marks 21a, 21b, 21c and 21d. The optical aligner 50 may include a plurality of aligners 50a, 50b, 50c, and 50d, and will be described hereinafter in detail.

The optical member 90 may be provided between the second and third aligners 50b and 50c. The second and third aligners 50b and 50c will be described hereinafter in detail.

While FIG. 1 illustrates an exposure apparatus 10 including four aligners 50a, 50b, 50c, and 50d, and a workpiece 21 including four alignment marks 21a, 21b, 21c, and 21d, example embodiments are not limited thereto.

Figure 2:
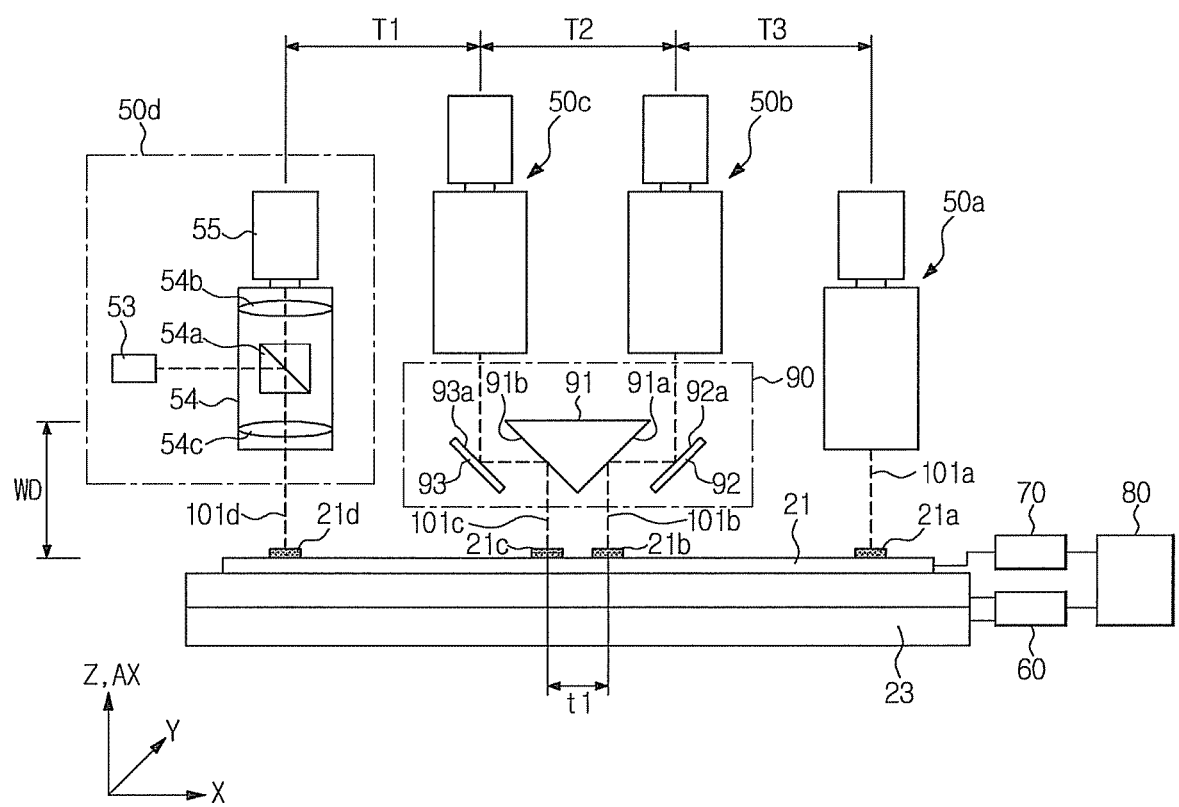
FIG. 2 is a view schematically illustrating an alignment device according to an example embodiment.

FIG. 2 is a view schematically illustrating an alignment device 200 according to an example embodiment.

As illustrated in FIGS. 1 and 2, the alignment device 200 may include a workpiece 21, a plurality of aligners 50a, 50b, 50c and 50d and an optical member 90.

The workpiece 21 includes a wafer or a substrate. The workpiece 21 is provided with the plurality of alignment marks 21a, 21b, 21c and 21d.

Each of the plurality of aligners 50a, 50b, 50c and 50d may include a light source 53, an optical microscope 54 and an image sensor 55. Each aligner 50a, 50b, 50c or 50d has a relatively long working distance WD (i.e. a distance from an aligner lens tip to the workpiece 21) owing to a combination of high and low magnifications because paths of alignment beams are lengthened.

The light source 53 includes a white light source, such as a halogen lamp, or high-strength multicolor Light Emitting Diodes (LEDs), but example embodiments are not limited thereto.

The optical microscope 54 includes a beam splitter 54a, an ocular lens 54b and an objective lens 54c.

The image sensor 55 includes a television camera (for example, a Charge Coupled Device (CCD)), but example embodiments are not limited thereto.

The workpiece 21 is provided with a first alignment mark 21a, a second alignment mark 21b, a third alignment mark 21c and a fourth alignment mark 21d, but example embodiments are not limited thereto and may include more or fewer alignment marks. The plurality of aligners 50a, 50b, 50c and 50d includes a first aligner 50a to measure the first alignment mark 21a, a second aligner 50b to measure the second alignment mark 21b, a third aligner 50c to measure the third alignment mark 21c and a fourth aligner 50d to measure the fourth alignment mark 21d. The first aligner 50a and the second aligner 50b are separated by a distance T3. The second aligner 50b and the third aligner 50c a separated by a distance T2. The third aligner 50c and the fourth aligner 50d are separated by a distance T1. Here, a distance T2 between the second aligner 50b and the third aligner 50c is greater than a distance t1 between the second alignment mark 21b and the third alignment mark 21c. While FIG. 2 illustrates the distances T1, T2, and T3 appear to be about the same distance, example embodiments are not limited thereto.

The optical member 90 is provided between the workpiece 21 and some of the plurality of aligners 50a, 50b, 50c and 50d, for example between the second and third alignment marks 21b and 21c and the second and third aligners 50b and 50c.

The optical member 90 may include a first optical element 91, a second optical element 92 and a third optical element 93.

The first optical element 91 includes a prism having a first reflective face 91a and a second reflective face 91b, but example embodiments are not limited thereto. The second optical element 92 is a first mirror having a third reflective face 92a facing the first reflective face 91a. The third optical element 93 is a second mirror having a fourth reflective face 93a facing the second reflective face 91b. In particular, the first reflective face 91a is oriented such that a normal of the first reflective face 91a and a second alignment beam 101b form an acute angle, and the second reflective face 91b is oriented such that a normal of the second reflective face 91b and a third alignment beam 101c form an acute angle.

With the above-described configuration, the optical member 90 is configured to diverge the alignment beams 101b and 101c reflected from the alignment marks 21b and 21c having the distance t1 there between and to transmit the beams 101b and 101c to the aligners 50b and 50c having the a horizontal separation distance 12 respectively. More specifically, after the prism 91 diverges the second alignment beam 101b and the third alignment beam 101c reflected from the second alignment mark 21b and the third alignment mark 21c via the first reflective face 91a and the second reflective face 91b thereof, the first mirror 92 transmits the second alignment beam. 101b to the second aligner 50b via the third reflective face 92a and the second mirror 93 transmits the third alignment beam 101c to the third aligner 50c via the fourth reflective face 93a. Thereafter, each image sensor 55 picks up an image of the alignment beam transmitted to the corresponding aligner 50a, 50b, 50c or 50d. Thereafter, the alignment device 200 may accurately control positions of the alignment marks 21a, 21b, 21c and 21d by moving the stage 23. In conclusion, as a result of the optical member 90 reducing interference between the aligners 50b and 50c, the alignment marks 21b and 21c may be accurately aligned although they have a small distance there between.

Figure 3:
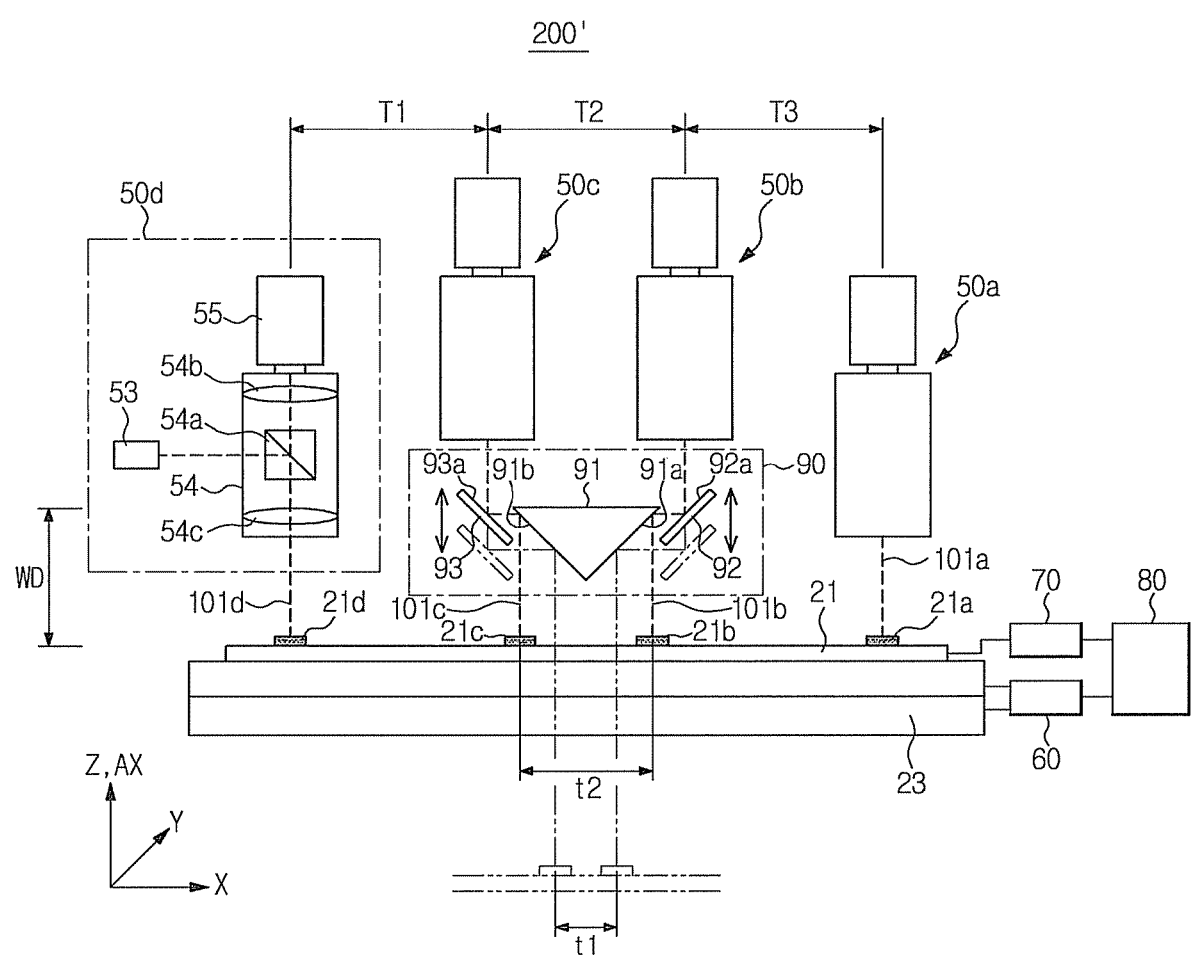
FIG. 3 is a view schematically illustrating an alternative configuration of the alignment device in FIG. 2.

FIG. 3 is a view schematically illustrating an alignment device 200' according to another example embodiment.

The following description of the alignment device 200' illustrated in FIG. 3 will focus upon differences from the alignment device 200 illustrated in FIG. 2 and identical configurations thereof will not be described.

As illustrated in FIGS. 1 and 3, the alignment device 200' may include the workpiece 21, the plurality of aligners 50a, 50b, 50c and 50d, the optical member 90, a transfer device (not shown), a stage 23, a drive unit 60, a stage position detector 70, and a main controller 80.

The workpiece 21 is provided with the plurality of alignment marks 21a, 21b, 21c and 21d. Here, the second alignment mark 21b and the third alignment mark 21c are spaced apart from each other by a distance t2. Of course, the distance t2 is smaller than the distance T2 between the second aligner 50b and the third aligner 50c.

The second optical element 92 and the third optical element 93 are movably provided. Specifically, the second optical element 92 and the third optical element 93 are vertically movable in an axial direction. The transfer device (not shown) may serve to move the second optical element 92 and the third optical element 93. The transfer device (not shown) may be driven manually or automatically.

If the distance between the alignment marks 21b and 21c of the workpiece 21 is changed from the distance t1 to the distance t2, the second optical element 92 of the optical member 90, i.e. the first mirror 92 is axially moved upward and the third optical element 93, i.e. the second mirror 93 is also axially moved upward. On the contrary, if the distance between the alignment marks 21b and 21c of the workpiece 21 is changed from the distance t2 to the distance t1, the first mirror 92 and the second mirror 93 of the optical member 90 are axially moved downward. In conclusion, even if the distance between the neighboring alignment marks 21b and 21c is changed, the alignment device 200' may accurately perform alignment.

In another example embodiment, the transfer device (not shown) may serve to move the first optical element 91. In this case, if the distance between the neighboring alignment marks 21b and 21c is increased to the distance t2, the prism 91 is axially moved downward. On the contrary, if the distance between the neighboring alignment marks 21b and 21c is reduced to the distance t1, the prism 91 is axially moved upward.

Figure 4:
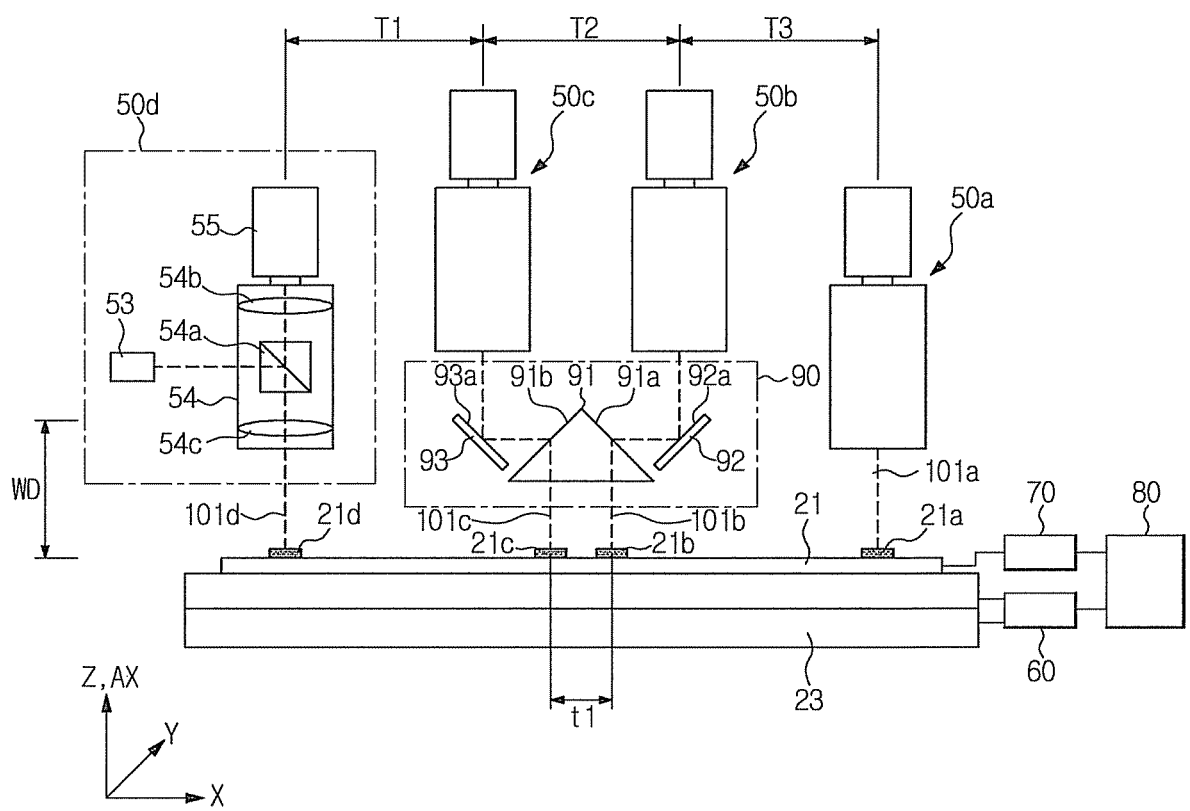
FIG. 4 is a view schematically illustrating an alternative configuration of the alignment device in FIG. 2.

In another example embodiment, as illustrated in FIG. 4, the prism 91 may be overturned. In this case, the first reflective face 91a of the prism 91 and the third reflective face 92a of the first mirror 92 are perpendicular to each other, and the second reflective face 91b of the prism 91 and the fourth reflective face 93a of the second mirror 93 are perpendicular to each other. The alignment beams 101b and 101c first pass through the bottom of the pyramidal prism 91 and thereafter, may be diverged through the first reflective face 91a and the second reflective face 91b.

Figure 5:
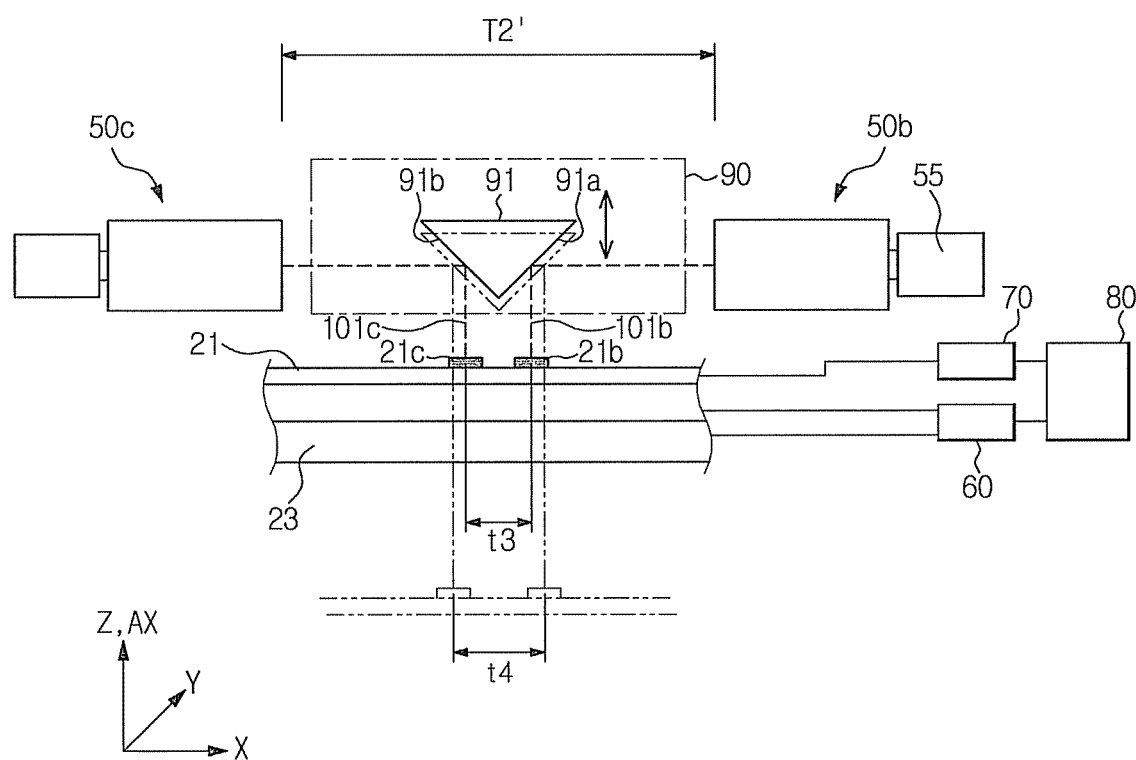
FIG. 5 is a view schematically illustrating an alignment device according to an example embodiment.

FIG. 5 is a view schematically illustrating an alignment device 500 according to another example embodiment. Here the second aligner 50b and the third aligner 50c are separated by a horizontal distance T2'.

The following description of the alignment device 500 illustrated in FIG. 4 will focus upon differences from the alignment device 200' illustrated in FIG. 3 and identical configurations thereof will not be described.

As illustrated in FIGS. 1 and 5, the alignment device 500 may include the workpiece 21, the plurality of aligners 50a, 50b, 50c and 50d, the optical member 90, a stage 23, a drive unit 60, a stage position detector 70, and a main controller 80.

The workpiece 21 is provided with the plurality of alignment marks 21b and 21c (reference numerals 21a and 21b are omitted). Here, the second alignment mark 21b and the third alignment mark 21c are spaced apart from each other by a distance t3. Of course, the distance t3 is smaller than the distance T2' between the second aligner 50b and the third aligner 50c.

The optical member 90 includes the first optical element 91. The first optical element 91 is a prism having the first reflective face 91a and the second reflective face 91b. Differently from FIGS. 2 and 3, the optical member 90 may not include the second optical element 92 and the third optical element 93. Thus, the second aligner 50b and the third aligner 50c are perpendicular to the axial direction.

With the above-described configuration, the optical member 90 diverges the alignment beams 101b and 101c reflected from the second and third alignment marks 21b and 21c and transmits the beams 101b and 101c to the second and third aligners 50b and 50c. More specifically, the prism 91 diverges the second alignment beam 101b and the third alignment beam 101c reflected from the second alignment mark 21b and the third alignment mark 21c via the first reflective face 91a and the second reflective face 91b thereof and transmits the beams 101b and 101c to the second aligner 50b and the third aligner 50c. Thereafter, each image sensor 55 picks up an image of the alignment beam transmitted to the corresponding aligner 50b or 50c. Thereafter, the alignment device 500 may accurately control positions of the alignment marks 21a, 21b, 21c and 21d by moving the stage 23. In conclusion, as a result of the optical member 90 reducing interference between the aligners 50b and 50c, the alignment marks 21b and 21c may be accurately aligned although they have a small distance there between.

In another example embodiment, the alignment device 500 may further include a transfer device (not shown). The transfer device (not shown) may serve to move the first optical element 91, i.e. the prism 91. In this case, if the distance between the neighboring alignment marks 21b and 21c is increased to the distance t4, the prism 91 is axially moved downward. On the contrary, if the distance between the neighboring alignment marks 21b and 21c is reduced to the distance t3, the prism 91 is axially moved upward.

In another example embodiment, the prism 91 may be overturned.

Figure 6:
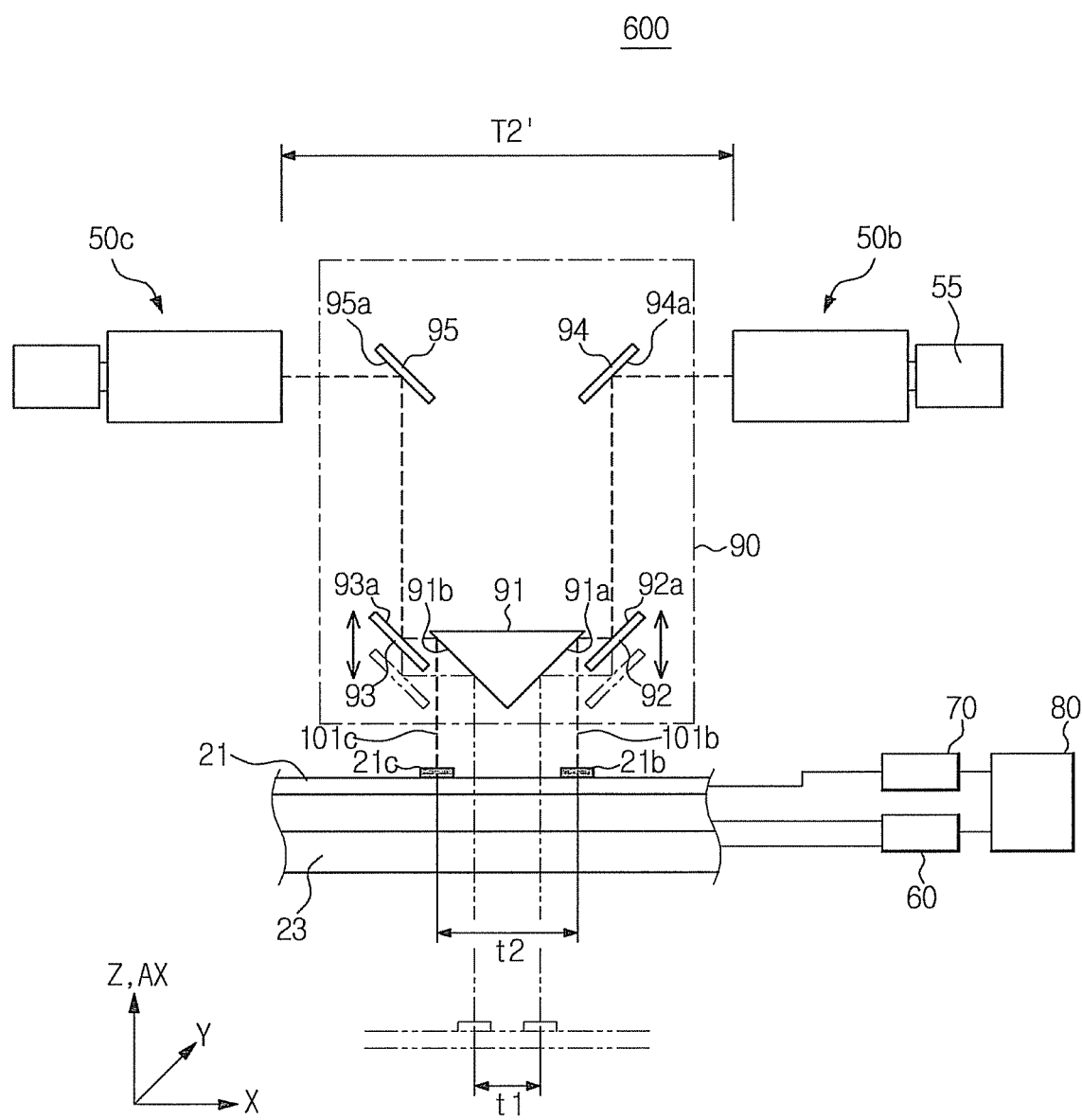
FIG. 6 is a view schematically illustrating an alignment device according to an example embodiment.

FIG. 6 is a view schematically illustrating an alignment device 600 according to another example embodiment. Here, the separation distance T2' indicates the separation between a horizontally arranged second aligner 50b and a horizontally arranged third aligner 50c.

The following description of the alignment device 600 illustrated in FIG. 6 will focus upon differences from the alignment device 200' illustrated in FIG. 3 and identical configurations thereof will not be described.

As illustrated in FIGS. 1 and 6, the alignment device 600 of FIG. 6 is configured such that a fourth optical element, i.e. a third mirror 94 is installed between the second aligner 50b and the optical member 90 and a fifth optical element, i.e. a fourth mirror 95 is installed between the third aligner 50c and the optical member 90. In this case, the second aligner 50b and the third aligner 50c are perpendicular to the axial direction.

With the above-described configuration, after the first optical element, i.e. the prism 91 diverges the second alignment beam 101b and the third alignment beam 101c reflected from the second alignment mark 21b and the third alignment mark 21c via the first reflective face 91a and the second reflective face 91b thereof, the first mirror 92 transmits the second alignment beam 101b to the third mirror 94 via the third reflective face 92a and the second mirror 93 transmits the third alignment beam 101c to the fourth mirror 95 via the fourth reflective face 93a. Thereafter, the third mirror 94 transmits the second alignment beam 101b to the second aligner 50b via a fifth reflective face 95a and the fourth mirror 95 transmits the third alignment beam 101c to the third aligner 50c via a sixth reflective face 95a. Thereafter, each image sensor 55 picks up an image of the alignment beam transmitted to the corresponding aligner 50b or 50c. Thereafter, the alignment device 600 may accurately control positions of the alignment marks 21a, 21b, 21c and 21d by moving the stage 23. In conclusion, as a result of the optical member 90 reducing interference between the aligners 50b and 50c, the alignment marks 21b and 21c may be accurately aligned although they have a small distance there between.

Figure 7:
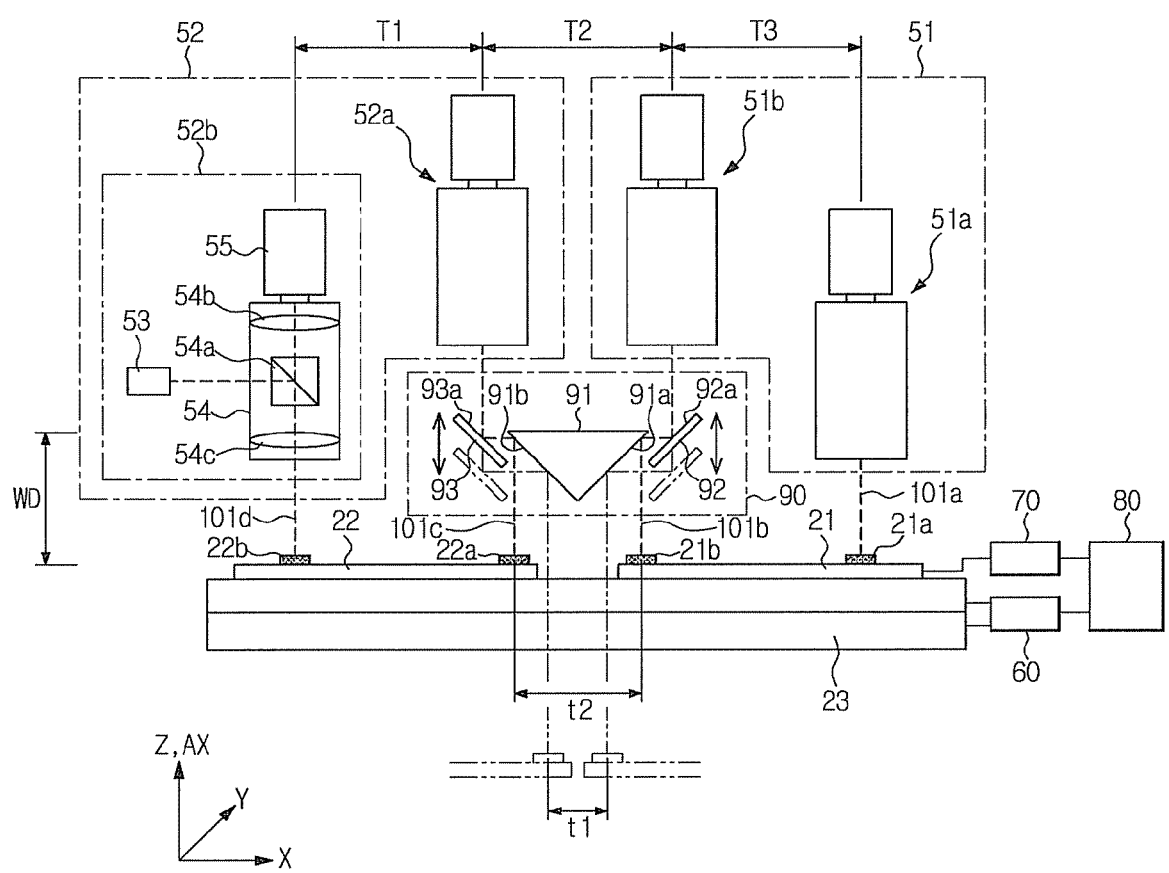
FIG. 7 is a view schematically illustrating an alignment device according to an example embodiment.

FIG. 7 is a view schematically illustrating an alignment device 700 according to another example embodiment.

As illustrated in FIG. 7, the alignment device 700 may include a plurality of workpieces 21 and 22, a plurality of aligners 51a, 51b, 52a and 52b and the optical member 90, a stage 23, a drive unit 60, a stage position detector 70, and a main controller 80.

Each of the plurality of workpieces 21 and 22 includes at least one alignment mark (e.g., 21a, 21b, 22a, 22b). FIG. 7 illustrates a first workpiece 21 having the first alignment mark 21a and the second alignment mark 21b and a second workpiece 22 having a first alignment mark 22a and a second alignment mark 22b, but example embodiments are not limited thereto.

A plurality of optical aligner systems 51 and 52 includes a first optical aligner system 51 and a second optical aligner system 52. The first optical aligner system 51 includes a first aligner 51a to measure the first alignment mark 21a and a second aligner 51b to measure the second alignment mark 21b. The second optical aligner system 52 includes a first aligner 52a to measure the first alignment mark 22a and a second aligner 52b to measure the second alignment mark 22b.

Here, the second aligner 51b of the first optical aligner system 51 and the first aligner 52a of the second optical aligner system 52 are spaced apart from each other by a distance T2. Also, the second alignment mark 21b of the first workpiece 21 and the first alignment mark 22a of the second workpiece 22 are spaced apart from each other by a distance t2.

The optical member 90 may include the first optical element 91, the second optical element 92 and the third optical element 93.

The first optical element 91 includes a prism having the first reflective face 91a and the second reflective face 91b. The second optical element 92 is the first mirror having the third reflective face 92a facing the first reflective face 91a. The third optical element 93 is the second mirror having the fourth reflective face 93a facing the second reflective face 91b.

With the above-described configuration, the optical member 90 diverges the alignment beams reflected from the plurality of alignment marks 21a, 21b, 22a and 22b and transmits the beams 101b and 101c to the plurality of aligners 51a, 51b, 52a and 52b respectively. More specifically, after the prism 91 diverges the second alignment beam 101b and the third alignment beam 101c reflected from the second alignment mark 21b of the first workpiece 21 and the first alignment mark 22a of the second workpiece 22 via the first reflective face 91a and the second reflective face 91b thereof, the first mirror 92 transmits the second alignment beam 101b to the second aligner 51b of the first optical aligner system 51 via the third reflective face 92a and the second mirror 93 transmits the third alignment beam 101c to the first aligner 52a of the second optical aligner system 52 via the fourth reflective face 93a. Thereafter, each image sensor 55 picks up an image of the alignment beam transmitted to the corresponding aligner 51a, 51b, 52a or 52b. Thereafter, the alignment device 700 may accurately control positions of the alignment marks 21a, 21b, 22a and 22b by moving the stage 23. In conclusion, as a result of the optical member 90 eliminating interference between the aligners 51b and 52a, the alignment marks 21b and 22a may be accurately aligned although they have an small distance there between.

The alignment device 700 may further include a transfer device (not shown). The transfer device (not shown) may serve to move the second optical element 92 and the third optical element 93 vertically in the axial direction. The transfer device (not shown) may be driven manually or automatically.

If the distance between the neighboring alignment marks 21b and 22a is changed from the distance t1 to the distance t2, the second optical element 92 of the optical member 90, may be axially moved upward and the third optical element 93 may also axially moved upward. On the contrary, if the distance between the neighboring alignment marks 21b and 22a is changed from the distance t2 to the distance t1, the first mirror 92 and the second mirror 93 of the optical member 90 may be axially moved downward. In conclusion, even if the distance between the neighboring alignment marks 21b and 22a is changed, the alignment device 700 may accurately perform alignment.

As is apparent from the above description, a substrate alignment device according to the example embodiments may perform alignment even if a distance between alignment marks is smaller than a distance between aligners.

Moreover, even if the distance between the alignment marks is changed, the substrate alignment device may perform alignment.

Although a few example embodiments have been particularly shown and described, it would be appreciated by those skilled in the art that changes may be made in these example embodiments, such as variations in form and/or detail, without departing from the spirit and scope of the claims.

What is claimed is:

1. An alignment device comprising:
   an optical aligner system including a plurality of aligners configured to measure a position of a workpiece having a plurality of alignment marks; and
   an optical member configured to diverge alignment beams reflected from neighboring alignment marks of the plurality of alignment marks and transmit the beams to neighboring aligners of the plurality of aligners respectively if a distance between the neighboring aligners is greater than a distance between the neighboring alignment marks,
   a portion of the optical member being configured to move in an axial direction perpendicular to the workpiece to enable measurement if the distance between the neighboring alignment marks changes and remains less than the distance between the neighboring aligners,
   wherein the optical member includes,
   a first optical element having a first reflective face and a second reflective face perpendicular to each other,
   a second optical element having a third reflective face facing the first reflective face of the first optical element, and
   a third optical element having a fourth reflective face facing the second reflective face the first optical element.

2. The device according to claim 1, wherein a fourth optical element having a fifth reflective face is provided between any one of the neighboring aligners and the second optical element, and a fifth optical element having a sixth reflective face is provided between the other one of the neighboring aligners and the third optical element.

3. The device according to claim 1, wherein the first reflective face and the second reflective face of the first optical element are arranged such that a normal of each reflective face and the alignment beam reflected from a corresponding one of the neighboring alignment marks form an acute angle.

4. The device according to claim 1, wherein the first optical element includes a prism.

5. The device according to claim 1, wherein the first optical element includes two symmetrically arranged mirrors.

6. The device according to claim 1, wherein the second optical element includes a mirror.

7. The device according to claim 1, wherein the third optical element includes a mirror.

8. The device according to claim 1, wherein
   the portion of the optical member configured to move in the axial direction includes the second and third optical elements, and the second optical element and the third optical element are configured to move in the axial direction to enable measurement even if the distance between the neighboring alignment marks is changed.

9. The device according to claim 1, wherein a working distance (WD) defines a separation distance from an aligner lens tip of each of the plurality of aligners to the workpiece owing to a combination of high and low magnifications.

10. The device according to claim 1, further comprising:
a stage configured to support the workpiece; and
a drive unit configured to move the stage.

11. The device according to claim 1, wherein each of the plurality of aligners includes:
a light source,
an optical microscope, and
an image sensor.

12. The device according to claim 1, wherein
the portion of the optical member configured to move in the axial direction includes the first optical element, and
the first optical element is configured to move in the axial direction to enable measurement even if the distance between the neighboring alignment marks is changed.

13. The device according to claim 12, further comprising:
a transfer device configured to move the first optical element, the second optical element and the third optical element.

14. An alignment device comprising:
a first optical aligner system configured to measure a position of a first workpiece having at least one alignment mark;
a second optical aligner system configured to measure a position of a second workpiece having at least one alignment mark; and
an optical member configured to diverge alignment beams reflected from the alignment marks of the first workpiece and the second workpiece and transmit the beams to the first optical aligner system and the second optical aligner system respectively if a distance between the first optical aligner system and the second optical aligner system is greater than a distance between the alignment marks of the first workpiece and the second workpiece,
a portion of the optical member being configured to move in an axial direction perpendicular to the first and second workpieces to enable measurement if the distance between the neighboring alignment marks of the first workpiece and the second workpiece changes and remains less than the distance between the first optical aligner system and the second optical aligner system,
wherein the optical member includes,
a first optical element having a first reflective face and a second reflective face perpendicular to each other,
a second optical element having a third reflective face facing the first reflective face of the first optical element, and
a third optical element having a fourth reflective face facing the second reflective face of the first optical element.

15. The device according to claim 14, wherein the first optical element is configured to move in an axial direction to enable measurement even if a distance between the first workpiece and the second workpiece is changed.

16. The device according to claim 14, wherein the second optical element and the third optical element are configured to move in an axial direction to enable measurement even if a distance between the first workpiece and the second workpiece is changed.

17. The device according to claim 14, wherein each of the first and second optical aligner systems includes a working distance (WD) from an aligner lens tip to a corresponding one of the first and second workpieces.

18. An alignment device comprising:
an optical aligner system including a plurality of aligners configured to measure a position of a workpiece having a plurality of alignment marks; and
an optical member configured to diverge alignment beams reflected from neighboring alignment marks of the plurality of alignment marks and transmit the beams to neighboring aligners of the plurality of aligners respectively if a distance between the neighboring aligners is greater than a distance between the neighboring alignment marks,
a portion of the optical member being configured to move in an axial direction perpendicular to the workpiece to enable measurement if the distance between the neighboring alignment marks changes and remains less than the distance between the neighboring aligners,
wherein the optical member includes:
a first optical element that is a triangular prism with a first face configured to be a lower surface parallel to the workpiece, and a second face and a third face perpendicular to each other,
a second optical element having a reflective face perpendicular to the second face of the first optical element,
a third optical element having a reflective surface perpendicular to the third face of the first optical element, and
the first optical element, second optical element, and third optical element are spaced apart from each other.

* * * * *